United States Patent [19]
Ellerson et al.

[11] Patent Number: 5,553,769
[45] Date of Patent: Sep. 10, 1996

[54] INTERCONNECTION OF A CARRIER SUBSTRATE AND A SEMICONDUCTOR DEVICE

[75] Inventors: James V. Ellerson, Endicott; Joseph Funari, Vestal; Jack A. Varcoe, Endwell, all of N.Y.

[73] Assignee: International Business Machine Corporation, Armonk, N.Y.

[21] Appl. No.: 445,382

[22] Filed: May 19, 1995

Related U.S. Application Data

[62] Division of Ser. No. 974,493, Nov. 12, 1992.

[51] Int. Cl.⁶ .................................................. H01L 21/50
[52] U.S. Cl. .................. 228/123.1; 228/175; 228/180.22
[58] Field of Search ......................... 228/123.1, 180.21, 228/180.22, 175

[56]         References Cited

U.S. PATENT DOCUMENTS

| | | | |
|---|---|---|---|
| 4,604,644 | 8/1986 | Beckham et al. | 228/175 X |
| 4,999,699 | 3/1991 | Christie et al. | 257/778 |
| 5,007,163 | 4/1991 | Pope et al. | 228/180.21 X |
| 5,170,930 | 12/1992 | Dolbear et al. | 228/180.22 X |
| 5,391,514 | 2/1995 | Gall et al. | 437/183 |

*Primary Examiner*—Kenneth J. Ramsey
*Attorney, Agent, or Firm*—Pollock, Vande, Sande & Priddy

[57]         ABSTRACT

Solder interconnection for forming connections between an integrated semiconductor device and a carrier substrate is provided. Located on the carrier substrate are electrodes and located between the electrodes and integrated semiconductor device are solder connections that have a relatively low melting point such that when the device is in operation, the solder connection will liquify thereby permitting expansion compensation between the substrate and semiconductor device.

12 Claims, 2 Drawing Sheets

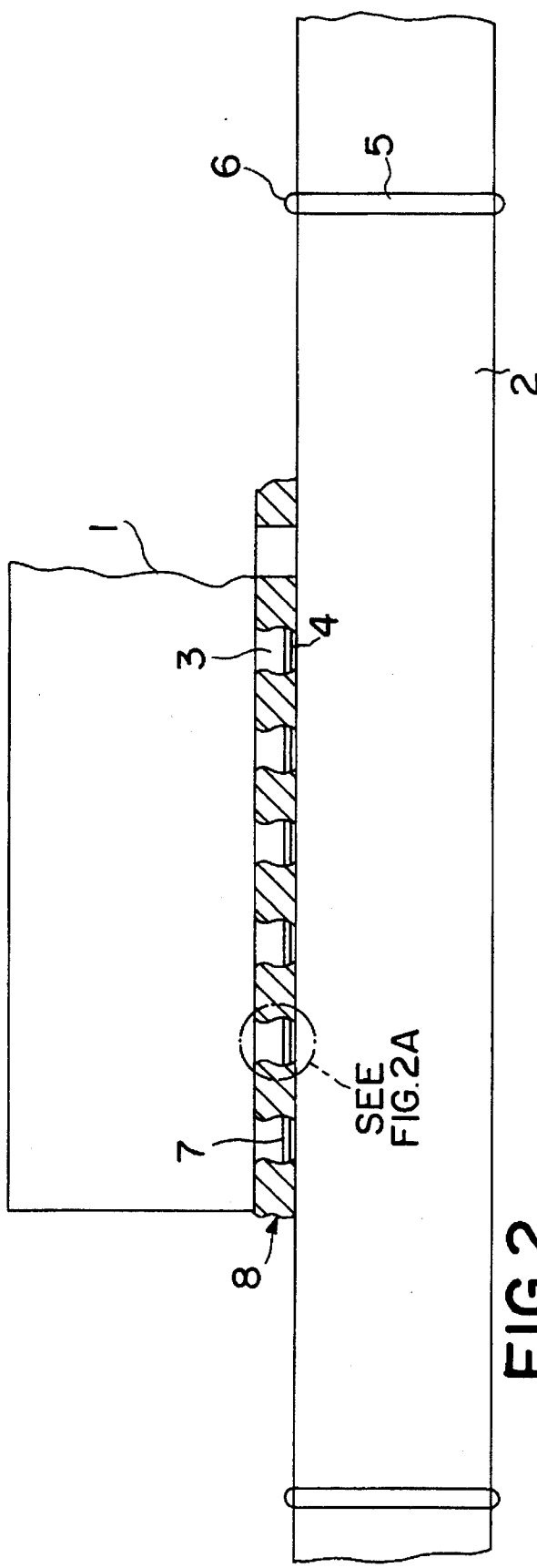
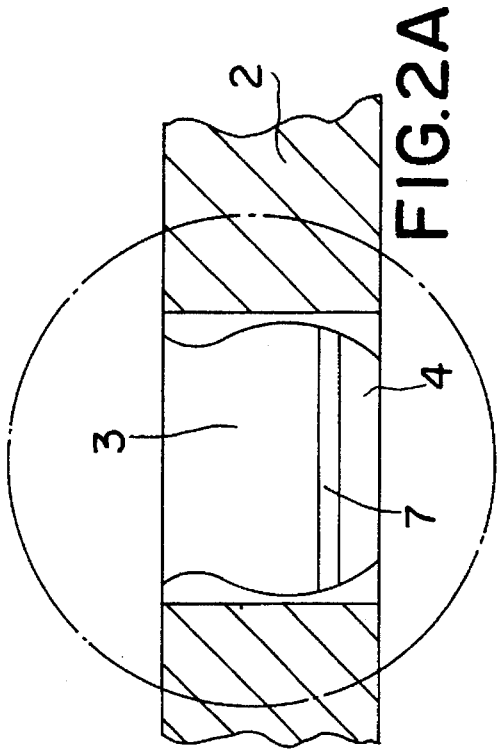
FIG.2
FIG.2A

INTERCONNECTION OF A CARRIER SUBSTRATE AND A SEMICONDUCTOR DEVICE

This is a divisional application of Ser. No. 07/974,493, filed on Nov. 12, 1992.

TECHNICAL FIELD

The present invention is concerned with interconnection structures for joining an integrated semiconductor device to a carrier substrate and particularly to a structure for forming solder interconnection joints that exhibit improved fatigue life and stability. The present invention is especially concerned with so-called "controlled collapse chip connection" or "C4" that employs solder-bump interconnections. Such is also referred to as the face down or flip-chip bonding. The present invention is also concerned with a method of making the interconnection structure.

BACKGROUND ART

Controlled collapse chip connection (C4) or flip-chip technology has been successfully used for over twenty years for interconnected high I/O (input/output) count and area array solder bumps on the silicone chips to the base rigid ceramic chip carriers, for example alumina carriers. The solder bump, typically a 95 Pb/5 Sn alloy provides the means of chip attachment to the ceramic chip carrier for subsequent usage and testing. For example, see U.S. Pat. Nos. 3,401,126 and 3,429,040 to Miller and assigned to the assignee of the present application, for a further discussion of the controlled collapse chip connection (C4) technique of face down bonding of semiconductor chips to a rigid ceramic carrier. Typically a malleable pad of metallic solder is formed on the semiconductor device contact site and solder joinable sites are formed on the conductors on the chip carrier.

The device carrier solder joinable sites are surrounded by non-solderable barriers so that when the solder on the semiconductor device contact sites melts, surface tension of the molten solder prevents collapse of the joints and thus holds the semiconductor device suspended above the carrier.

With the development of the integrated circuit semiconductor device technology, the size of individual active and passive elements have become very small, and the number of elements in the device has increased dramatically. This results in significantly larger device sizes with larger numbers of I/O terminals.

An advantage of solder joining a device to a substrate is that the I/O terminals can be distributed over substantially the entire top surface of the semiconductor device. This allows an efficient use of the entire surface, which is more commonly known as area bonding.

Usually, the integrated circuit semiconductor devices are mounted on supporting substrates made of materials with thermal coefficients of expansion that differ from the thermal coefficient of expansion of the material of the semiconductor device, e.g. silicon. Normally the device is formed of monocrystalline silicon with a thermal coefficient of expansion of $2.5 \times 10^{-6}$ per °C. and the substrate is formed of a ceramic material typically alumina with a thermal coefficient of expansion of $5.8 \times 10^{-6}$ per °C. In operation, the active and passive elements of the integrated semiconductor device inevitably generate heat resulting in temperature fluctuations in both the devices and the supporting substrate since the heat is conducted through the solder bonds. The devices and the substrate thus expand and contract in different amounts with temperature fluctuations, due to the different coefficients of expansion. This imposes stresses on the relatively rigid solder terminals.

The stress on the solder bonds during operation is directly proportional to: (1) the magnitude of the temperature fluctuations; (2) the distance of an individual bond from the neutral or central point (DNP); and, (3) the difference in the coefficients of the expansion of the material of the semiconductor device and the substrate, and inversely proportional to the height of the solder bond, that is the spacing between the device and the support substrate. The seriousness of the situation is further compounded by the fact that as the solder terminals become smaller in diameter in order to accommodate the need for greater density, the overall height decreases.

There have been various suggestions to increase the fatigue life. For example, an improved solder interconnection structure with increased fatigue life is disclosed in U.S. Pat. No. 4,604,644 to Beckham et al. and assigned to the assignee of the present application, disclosure of which is incorporated herein by reference. In particular, U.S. Pat. No. 4,604,644 discloses a structure for electrically joining a semiconductor device to a support substrate that has a plurality of solder connections where each solder connection is joined to a solder wettable pad on the device and a corresponding solder wettable pad on the support substrate. Dielectric organic material is disposed between the peripheral area of the device and the facing area of the substrate, which material surrounds at least one outer row and column of solder connections but leaves the solder connections in the central area of the device free of dielectric organic material.

More recently, further improved solder interconnection structures with even greater fatigue life have been disclosed in U.S. Pat. Nos. 4,999,699 and 5,089,440 to Christie et al. and assigned to the assignee of the present application, disclosures of which are incorporated herein by reference. In particular, the solder interconnection structure of these patents includes filling the gap between the carrier substrate and semiconductor device with a composition obtained from curing a curable composition containing a binder which is a cycloaliphatic polyepoxide and/or a cyanate ester or prepolymer thereof and a filler.

Moreover, solder interconnection between an organic substrate and semiconductor divided has been disclosed in U.S. Pat. No. 5,121,190 to Hsiao et al., and assigned to the assignee of the present application, disclosure of which is incorporated herein by reference. In particular, prior to the invention disclosed in U.S. Pat. No. 5,121,190, the attachment of a semiconductor device to organic substrates employing a C4 type connection had not been suggested. This was probably due to the fact that organic substrates present significant additional problems not experienced with employing ceramic substrates. For example, the differences in the coefficients of thermal expansion of the material of the semiconductor device, e.g. silicon and organic substrates greatly exceed that experienced with ceramic substrates. In fact, coefficient of thermal expansion mismatch is so great that attempts to attach the device to an organic substrate result in destroying any solder bond. Also, due to the flexible nature of organic substrates, including those that are fiber reinforced, these substrates tend to warp or bend during processing and temperature fluctuations. This greatly magnifies the problems associated with the destructive stress forces that would be placed upon any solder joint between the substrate and semiconductor device.

The invention of U.S. Pat. No. 5,121,190 made it possible to form a connection between an integrated semiconductor device and an organic substrate. This is accomplished by filling the gap between the carrier substrate and the semiconductor device with a composition obtained from curing a curable composition containing a thermo-setting binder and a filler. The binder employed typically has a viscosity at normal room temperatures (25° C.) of no greater than about 1,000 centipoise. The filler typically has a maximum particle size of 50 microns.

Although, the above more recent techniques have been quite successful, there still remains room for alternative methods and/or improvements in increasing the fatigue life of the interconnections.

SUMMARY OF INVENTION

The present invention is concerned with enhancing the fatigue life of C4 solder connections. In particular, the present invention is concerned with a solder interconnection for forming connections between an integrated semiconductor device and a carrier substrate. The interconnection of the present invention includes a plurality of solder connections located between electrodes on the carrier substrate and the semiconductor device. These solder connections have a melting point that is low enough that they are capable of liquefying at those temperatures at which the interconnection are to be subjected during use.

In addition, the present invention is concerned with a method of increasing the fatigue life of solder interconnections between a semiconductor device and a supporting substrate. The method includes providing on a supporting substrate a plurality of electrodes and providing on the surface of the electrodes that is remote from the supporting substrate a solder material that has a melting point which will liquify at the temperatures to which the interconnections are to be subjected during use. A semiconductor device is positioned so that the solder connections are between it and the electrodes. Heat is applied to thereby cause the solder material to liquify. Upon removal of the heat, the solder material is caused to solidify and thereby interconnect the semiconductor device and supporting substrate.

SUMMARY OF DRAWINGS

FIG. 2 is a schematic diagram of a solder interconnection pursuant to the present invention as assembled.

FIG. 2a is an enlarged sectional view of an interconnection pursuant to the present invention.

BEST AND VARIOUS MODES FOR CARRYING OUT INVENTION

Figure 1:
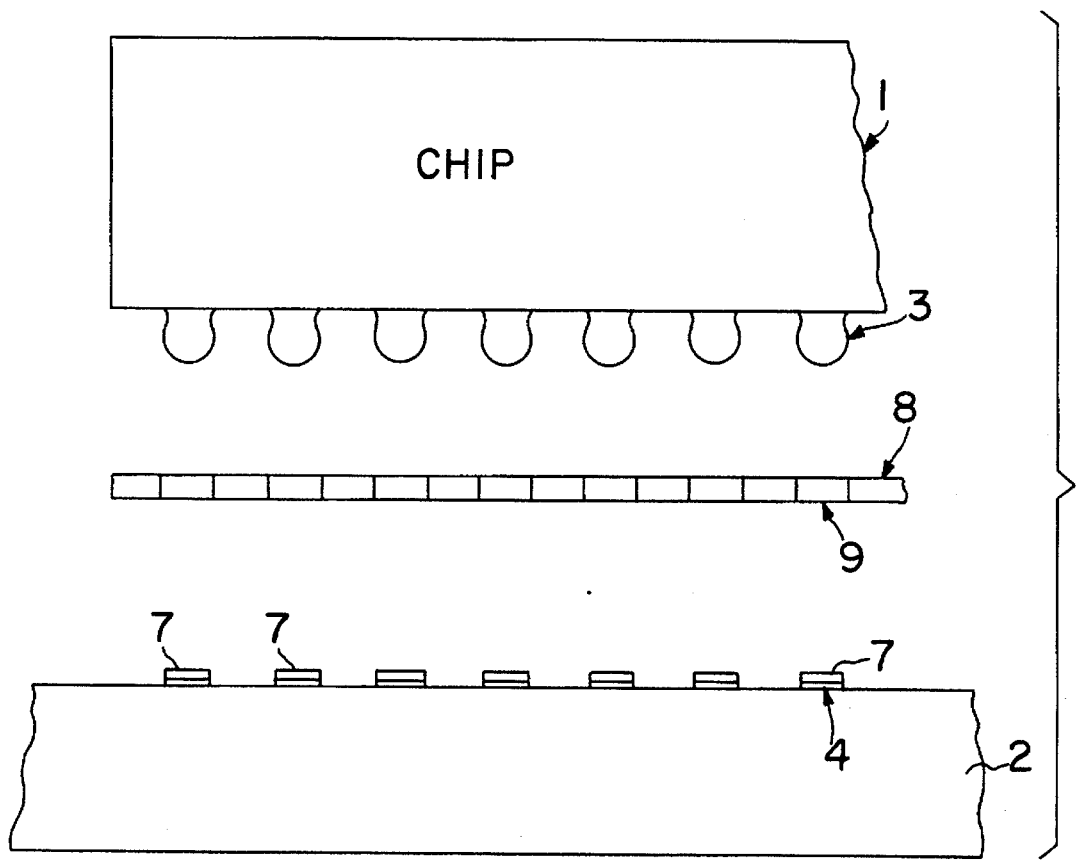
FIG. 1 is a schematic diagram of a solder interconnection pursuant to the present invention prior to assembly.

To facilitate an understanding of the present invention, reference is made to the figures, wherein the same numeral represents the same or equivalent structure in the different figures. In the figures, numeral 1 represents a semiconductor chip joined to the chip carrier 2 by solder bumps 3 mated to pads 4. I/O pins 5 extend and protrude from the carrier 2, with a small portion 6 of the pins protruding from the other side of the carrier for carrying current thereto. When the carrier is an organic substrate, the pins (5) as such are not required. Instead, electrically conductive circuitry and interconnections would be provided such as at the periphery of the substrate for connection to a desired structure. The relatively low melting point solder material 7 pursuant to the present invention located between solder bumps 3 and pads 4 make the connection liquid during normal operating temperatures thereby providing some ability for the chip junction to move and thereby freeing up the stress on the junction.

The solder material typically has a melting point from about 110° to about 120° F., preferably a melting point from about 115° to about 120° F. and most preferably a melting point of about 117° F. Typical low melting alloys contain about 44.5 to about 44.7 percent bismuth, about 22.5 to about 22.7 percent lead, about 8.0 to about 8.3 percent tin, about 5.0 to about 5.3 percent cadmium, and about 17.5 to about 18.1 percent indium. Of course other low melting alloys can be used if desired. However, the percentage of tin in such low melting alloys should be low enough to avoid chemical reaction with copper circuitry to the extent that could damage the circuitry by etching. Solder material 7 is typically provided as films about 1 to about 4 mils and more typically about 2 to about 3 mils.

Since low melting solders typically adversely effect or damage the pads 4 which are typically copper, it is quite surprising that a low melting point solder could be used pursuant to the present invention without the concomitant adverse effect of deteriorating the copper pads. As discussed above, an acceptable low melting solder would have a relatively low tin content in order to minimize the reaction between the copper and tin.

The solder bumps 3, although preferred, are not required if the low melting point solder is employed in thick enough films (typically about 6 to about 10 mils) to provide the desired spacing between the chip 1 and carrier 2. Moreover, if desired, the solder bumps 3 can be from a low melting solder. However, according to preferred aspects of the present invention, solder bumps 3 are made of a solder material that has a melting point above that for solder material 7 and above the temperature at which the device will normally be subjected during use. Typical melting points for preferred solder material are about 350° to about 400° and more typically about 380° to about 400°. Typical solder bump materials used with silicon devices are 95% lead and 5% tin.

According to preferred aspects of the present invention, the lower melting point solder 7 includes along with the other alloy metals those metals that are present in the preferred solder bumps 3 and also are presently selected such that the metals of the lower melting solder will diffuse and combine with the solder bumps 3 to thereby assure a connection between the solder bumps 3 and lower melting solder 7. This connection as discussed above is solid at room temperature but liquid above the temperature at which the device is to be subjected during operation.

Even when liquified, the lower melting solder will not flow from the respective conductors to which such is coupled in the absence of any external forces.

In the configurations wherein solder bumps 3 are not present or wherein solder bumps are low melting solder, it will be desirable to include some means to maintain the solder material 7 in place when it liquifies such as by employing adhesive member 8 and/or employing dam structures at the ends of pads 4. The liquification of the lower melting solder 7 as discussed allows for expansion compensation between the substrate and chip due to the difference in coefficients of thermal expansion thereof while simultaneously assuring a sound electrical connection at the necessary chip-substrate junctions.

According to preferred aspects of the present invention, an interim adhesive member 8 is located between the chip and circuit board. Adhesive member 8 includes perforations or vias 9 to permit placement of the solder balls 3 through the film to contact the lower melting solder material 7. The adhesive member 8 is not required but is helpful to assure that the chip is maintained in position, particularly when the chip and substrate are positioned in a substantially vertical orientation. Since the adhesive member 8 is to act as the means to maintain low melting solder in place during use upon liquification, such is not normally removed from the structure. In the preferred aspects of the present invention employing solder balls 3, the thickness of adhesive member 8 is less than that of solder balls 3. Suitable materials for the adhesive member include pressure sensitive adhesives, thermo-setting or thermoplastic polymers and more typically a polyimide film tape that is about 2 ±0.5 mils in thickness.

In the alternative, if desired, the compositions disclosed in U.S. Pat. Nos. 5,089,440 and 5,121,190 can be used in place of adhesive member 8. Various other thermosetting and thermoplastic compositions are commercially available and suitable as the adhesive member and typically should approximate the CTE of the solder bump which is typically about 40 ppm/degree C.

The substrate 2 employed can be organic, inorganic or composite in nature. Typical substrates are ceramic modules or multi-layered printed circuit boards. The preferred ceramic substrates include aluminum oxides, silicon oxides and silicates such as aluminum silicate. Typical organic printed circuit boards include conventional FR-4 epoxy and laminates based on high temperature resins such as high temperature epoxies, polyimides, cyanates (triazines), fluoropolymers, benzocyclobutenes, polyphenylene sulfides, polysulfones, polyetherimides, polyetherketones, polyphenylquinoxalines, polybenzoxazoles, and polyphenyl benzobisthiazoles.

Typical pads 4 are copper.

The structures of the present invention can be prepared by providing the desired substrate having the electrodes such as copper pads thereon which function as the conductors of the substrate 2. The low melting point solder alloy 7 is then applied to the respective pads 4 and an apertured adhesive 8 (the apertures having the same pattern as the conductors) positioned on the substrate to thereby substantially surround the respective conductors 4. The low melting solder 7 can be screened onto the pads or applied as a solid material. The chip 1 is then applied and positioned on the substrate-adhesive structure and heat to elevated temperatures around the melting point of the alloy employed is applied. The heat is then removed and solidification of the solder occurs. Preferably, the chip includes its own solder balls 3 which in turn align with the respective low melting point solder alloy.

What is claimed is:

1. A method of increasing the fatigue life of solder interconnections between a semiconductor device and a supporting substrate comprising providing on a supporting substrate a plurality of electrodes; providing on the surface of said electrodes that is remote from said supporting substrate a low melting solder material having a melting point which will liquify to which the interconnections are subjected during use; positioning a semiconductor so that said device solder connections are located between said semiconductor device and electrodes; applying heat to thereby cause the solder connections to liquify; then removing said heat to thereby cause the solder material to solidify and interconnect said semiconductor device supporting substrate.

2. The method of claim 1 wherein said solder material has a melting point from about 110° to about 120° F.

3. The method of claim 1 wherein said solder material has a melting point from about 115° to about 120° F.

4. The method of claim 1 wherein said solder material has a melting point of about 117° F.

5. The method of claim 1 wherein said solder material connections contain about 44.5 to about 44.7% bismuth, about 22.5 to about 22.7% lead, about 8.0 to about 8.5% tin, about 5.0 to about 5.3% cadmium, and about 17.5 to about 18.1% indium.

6. The method of claim 1 wherein the thickness of said solder material is about 2 to about 4 mils.

7. The method of claim 1 wherein said electrodes are copper.

8. The method of claim 1 which further includes providing solder bumps located between said semiconductor device and low melting solder connections.

9. The method of claim 8 wherein said solder bumps have melting point above that of said low melting solder connections.

10. The method of claim 9 wherein said solder bumps are Pb/Sn solder bumps.

11. The method of claim 1 wherein the heat applied raises the temperature of the structure to about 110° to about 120° F.

12. The method of claim 1 which further includes providing an adhesive material between said semiconductor device and said supporting substrate.

\* \* \* \* \*